(12) United States Patent
Kurimoto et al.

(10) Patent No.: US 6,870,265 B2
(45) Date of Patent: Mar. 22, 2005

(54) SEMICONDUCTOR DEVICE AND MANUFACTURING METHOD THEREOF

(75) Inventors: Kazumi Kurimoto, Osaka (JP); Yoshiaki Kato, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/237,692

(22) Filed: Sep. 10, 2002

(65) Prior Publication Data

US 2003/0218254 A1 Nov. 27, 2003

(30) Foreign Application Priority Data

Sep. 11, 2001 (JP) ........................................ 2001-274544

(51) Int. Cl.$^7$ .............................................. H01L 23/48
(52) U.S. Cl. ..................................... 257/758; 257/762
(58) Field of Search ................................ 257/750–771, 257/300–311

(56) References Cited

U.S. PATENT DOCUMENTS

2002/0024115 A1 * 2/2002 Ibnabdeljalil et al. ....... 257/620
2002/0175415 A1 * 11/2002 Matsunaga .................. 257/758

FOREIGN PATENT DOCUMENTS

| JP | 63-25951 | 2/1988 |
|---|---|---|
| JP | 2723559 | 11/1997 |
| JP | P2000-277465 A | 10/2000 |
| JP | P 2001-185626 | 7/2001 |

OTHER PUBLICATIONS

Patent Abstract of Japan, Publication No. 02125638 A, May 14, 1990 "Semiconductor Integrated Circuit Device", English Abstract.

* cited by examiner

Primary Examiner—H. Jey Tsai
(74) Attorney, Agent, or Firm—McDermott Will & Emery LLP (57) ABSTRACT

In a semiconductor device, after the deposition of an interlayer insulating film is deposited on a substrate on which an element and wiring of a lower layer are provided, a via hole reaching to the wiring and an annular groove reaching to an annular pad are formed in the interlayer insulating film, in the internal element region and in the chip area outer periphery region, respectively. Next, by etching using a photoresist pattern formed on the inetrlayer insulating film as a mask, a larger groove for use in wiring than the via hole is formed in the internal element region. At this time, a portion of the annular groove, positioned in the side portion of the chip area outer periphery region, is filled with a portion of the photoresist pattern, thereby decreasing the amount of Cu and the like released from the bottom of the annular groove.

12 Claims, 10 Drawing Sheets

INTERNAL ELEMENT REGION | CHIP REGION OUTER PERIPHERY REGION

FIG. 5B

INTERNAL ELEMENT REGION | CHIP REGION OUTER PERIPHERY REGION

SEMICONDUCTOR DEVICE AND MANUFACTURING METHOD THEREOF

BACKGROUND OF THE INVENTION

In recent years, with increasing demand for higher packing density of semiconductor devices, the miniaturization of internal elements, such as a transistor, and the multi-layering of wiring have been advancing. Particularly, the performance of wiring comes to exert a large influence on the performance of a semiconductor device, and thus the damascene process is introducing copper wiring of low resistance in place of aluminum wiring.

Figure 8A:
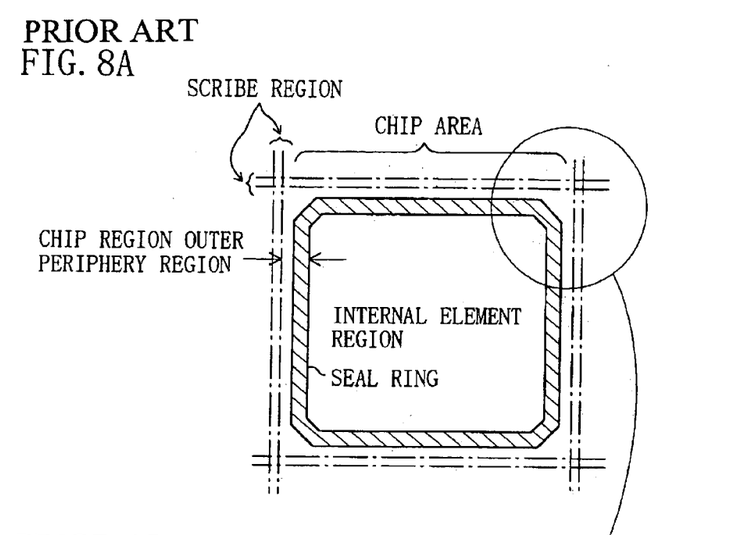
FIGS. 8A and 8B are a plan view for showing a chip area of a conventional wafer and a partial plan view for showing, through a insulating film, the neighborhood of a chip area corner portion of a semiconductor device provided in the chip area.
Figure 8B:
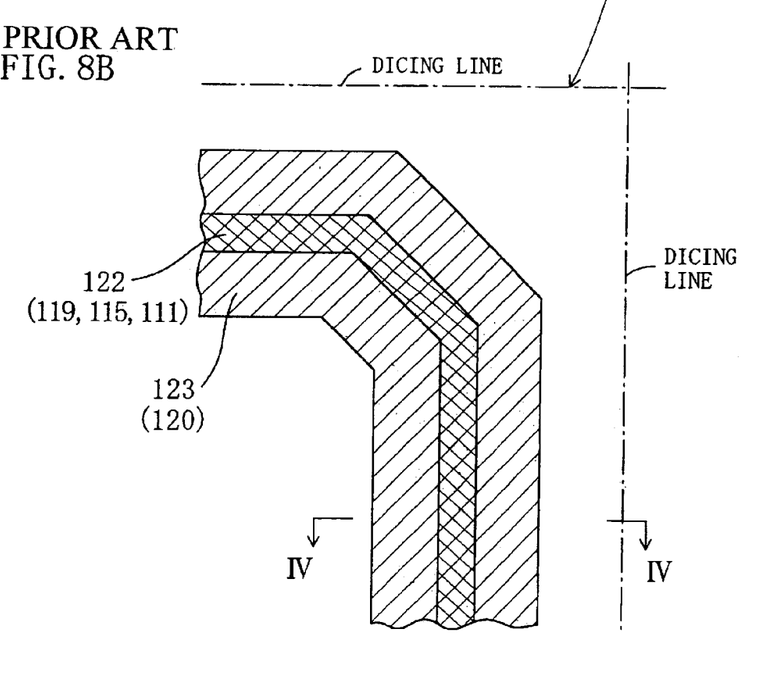

FIGS. 8A and 8B are a plan view for showing a chip area in a conventional wafer and a partial plan view for showing, through an insulating film, the neighborhood of a chip area corner portion of a semiconductor device provided in the chip area. Also, FIG. 9 is a cross sectional view of the conventional semiconductor device, taken along a VIII—VIII line shown in FIG. 8B.

Figure 9:
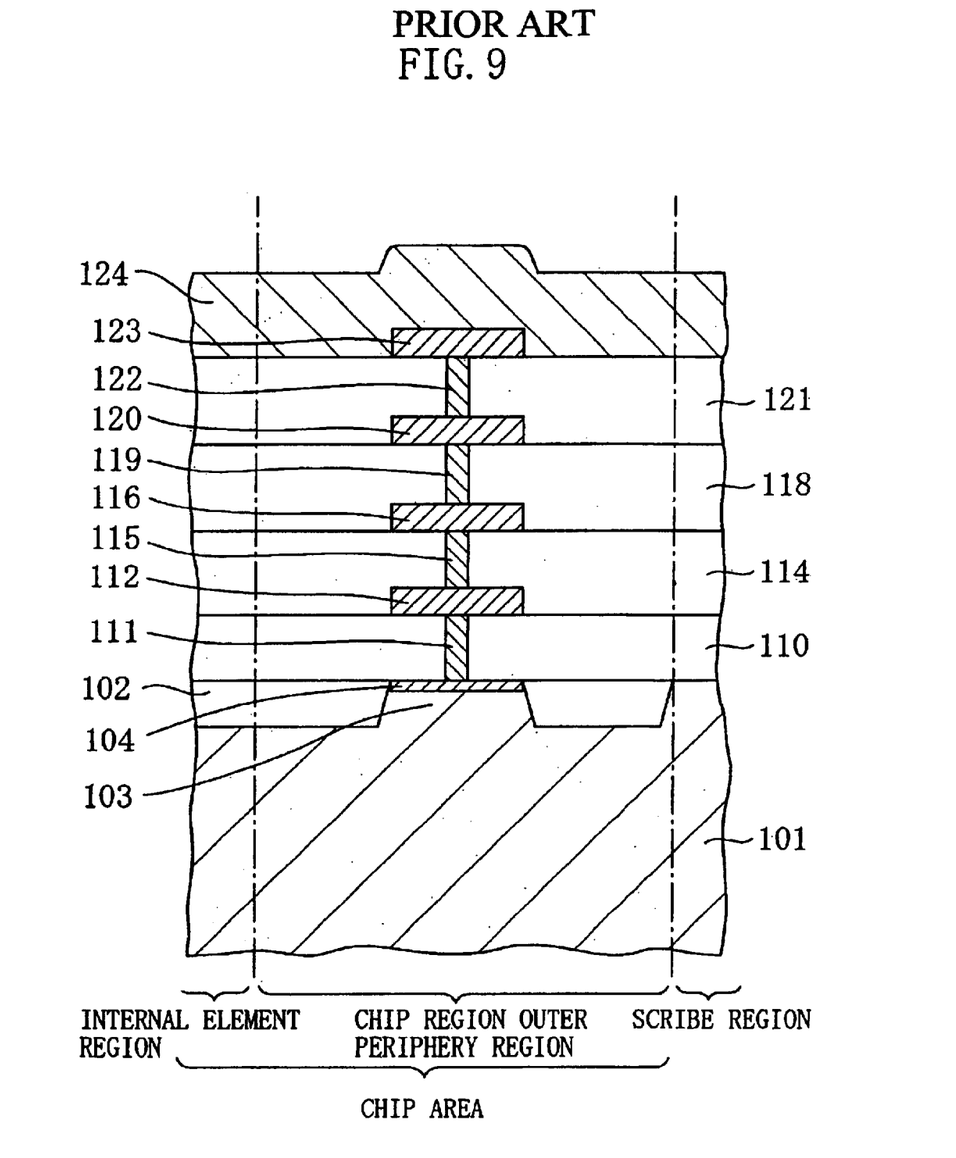
FIG. 9 is a cross sectional view of the conventional semiconductor device, taken along a VIII—VIII line shown in FIG. 8B.

As shown in FIGS. 8A and 8B and FIG. 9, this semiconductor device comprises a silicon substrate 101, element isolation 102 formed on the silicon substrate 101 and enclosing an active region 103, a diffusion layer 104 formed in the active region 103, a first interlayer insulating film 110 provided on the silicon substrate 101, a second interlayer insulating film 114 provided on the first interlayer insulating film 110, a third interlayer insulating film 118 provided on the second interlayer insulating film 114, a fourth interlayer insulating film 121 provided on the third interlayer insulating film 118, and a humidity-resistant insulating film 124 provided on the fourth interlayer insulating film 121. Further, in the chip area outer periphery region, the semiconductor device comprises a first annular wall 111 reaching to the diffusion layer 104 through the first interlayer insulating film 110, a first annular pad 112 provided on the first interlayer insulating film 110 and connected to the first annular wall 111, a second annular wall 115 reaching to the first annular pad 112 through the second interlayer insulating film 114, a second annular pad 116 provided on the second interlayer insulating film 114 and connected to the second annular wall 115, a third annular wall 119 reaching to the second annular pad 116 through the third interlayer insulating film 118, a third annular pad 120 provided on the third interlayer insulating film 118 and connected to the third annular wall 119, a fourth annular wall 122 reaching to the third annular pad 120 through the fourth interlayer insulating film 121, and a fourth annular pad 123 provided on the fourth interlayer insulating film 121 and connected to the fourth annular wall 122. Each of the annular walls 111, 115, 119, and 122 and each of the annular pads 112, 116, 120 and 123 described above configure a seal ring for stopping the intrusion of moisture and humidity into the internal element region.

Figure 10:
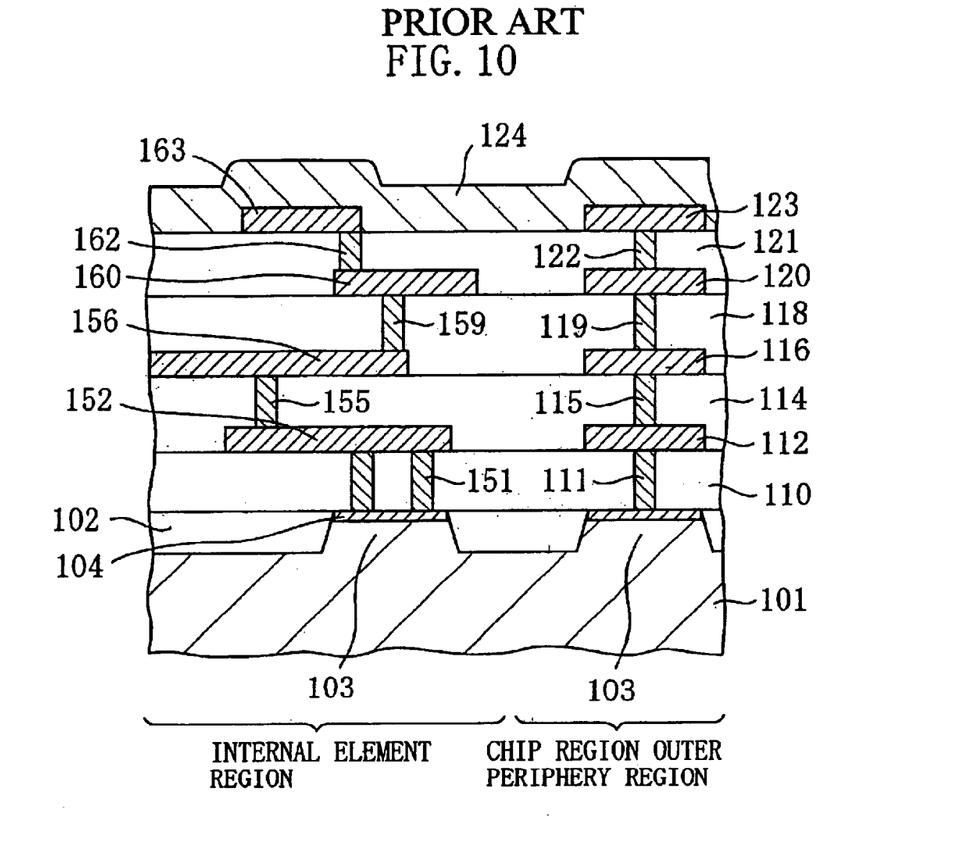
FIG. 10 is a cross sectional view for showing a comparison between the structures of the chip area and the internal element region of the conventional semiconductor device.

FIG. 10 is a cross sectional view for showing a comparison between the structures of the chip area outer periphery region and the internal element region in the conventional semiconductor device. As shown in the same figure, the first annular wall 111 in the chip area outer periphery region is formed by filling a contact hole with metal or polycrystalline silicon at the same time as a contact plug 151 in the internal element region. The first annular pad 112 is formed by patterning a metal film at the same time as local wiring 152 in the internal element region. The second annular wall 115 in the chip area outer periphery region is formed by filling a via hole with metal at the same time as a first via plug 155 in the internal element region. The second annular pad 116 is formed by patterning a metal film at the same time as a first layer wiring 156 in the internal element region. The third annular wall 119 in the chip area outer periphery region is formed by filling a via hole with metal at the same time as a second via plug 159 in the internal element region. The third annular pad 120 is formed by patterning a metal film at the same time as a second layer wiring 160 in the internal element region. The fourth annular wall 122 in the chip area outer periphery region is formed by filling a via hole with metal at the same time as a third via plug 162 in the internal element region. The fourth annular pad 123 and third layer wiring 163 in the internal element region are formed by patterning a metal film at the same time.

Herein, a coating film used as the interlayer insulating film is generally an organic film. Even in the case of using a film containing an inorganic substance as main constituent, such as a silica film, an organic component is often additively used therein so as to suppress the occurrence of cracks during sintering. Further, even in the use of a silica film, which could be turned into an almost perfectly inorganic silicon oxide film by sintering at about 800° C., when the silica film is formed on wiring, the organic component added as a solvent is left in the film without being perfectly eliminated, because heat treatment is limited to about 400° C. In this way, an insulating film containing an organic component is inherently high in absorptivity for moisture or water permeability. Therefore, if after formed into a film, the coating film is exposed, moisture comes to be easily incorporated into the interior of the semiconductor device, thus causing a deterioration in reliability of the semiconductor device.

For this reason, in the conventional semiconductor device shown in FIGS. 8 to 10, the outer periphery of the internal element region is enclosed with a seal ring composed of the annular pad and annular wall, thereby providing a configuration in which moisture is prevented from entering into interlayer insulating films, even after semiconductor chips have been separately cut and divided in scribe regions.

However, when attempting to form the conventional semiconductor device described above by using a dual damascene process, the following problems may be conceived.

That is, in a dual damascene process, after the opening of a ring-shaved groove for use in an annular wall (for example, the third annular wall 119) on the upper layer side and a hole for use in a plug (for example, the second via plug 159) on the upper layer side, during a dry etching process for forming an annular groove for use in an annular pad (for example, the third annular pad 120) on the upper layer side and a groove for use in wiring (for example, the second layer wiring 160) on the upper layer side, there exist the annular grooves, openings, having a large area. For this reason, there has been a fear that serious plasma damage is caused to wiring (for example, the local wiring 152 and the first layer wiring 156) on the lower layer side and the silicon substrate. Also, at this time, Cu and the like are released as gas from an portion exposed at the bottom of the annular groove in an annular pad (for example, the second annular pad 116) of the lower layer, and thus variations in the dry etching rate have been resulted sometimes. As a result, variations have been caused in the depth of grooves for use in wiring (for example, the second layer wiring 160) in the internal element region, thus resulting in a fear that variations may occur in wiring resistance.

SUMMARY OF THE INVENTION

An object of the invention is to provide a semiconductor device with wiring having small variations in wiring resistance and minor plasma damage in the substrate and wiring while preventing the intrusion of moisture into the interlayer insulating film from the outside.

The semiconductor device according to the invention comprises a plurality of wiring layers composed of each of a plurality of interlayer insulating films and each of a plurality of wiring lines provided above a semiconductor layer on a substrate, a plug for making a vertical connection between wiring lines of the plurality of wiring layers or between the wiring and the semiconductor layer, an internal element region in which an element provided in the semiconductor layer, the wiring layer, and the plug are disposed, and an annular seal ring provided on the semiconductor layer through the plurality of interlayer insulating films and enclosing the internal element region, wherein at least one interlayer insulating film of the plurality of interlayer insulating films is filled around wiring in one wiring layer of said plurality of wiring layers and a plug connected to this wiring, and at least a portion of the part passing through at least one interlayer insulating film of said seal ring has a vertical-plate-like annular wall extending from the upper end to the lower end of this interlayer insulating film.

According to this, a portion of the seal ring, passing through at least one interlayer insulating film, has a vertical-plate-like annular wall, and therefore, during forming a wiring groove to be formed in the same interlayer insulating film, an annular groove for use in an annular wall remains filled with a mask member. As a result of this, in a step for forming the annular groove, it is possible to suppress the occurrence of plasma damage in the substrate and wiring in a lower position than the annular groove. Further, since the occurrence of a foreign substance from the bottom of the annular groove is suppressed, change in an etching rate can be suppressed, and thereby, it is possible to suppress the depth of the wiring groove buried in the same interlayer insulating film, i.e. change in the thickness of wiring.

The semiconductor device further comprising a protective insulating film covering the internal element region above it and having a function of preventing the intrusion of a foreign substance, wherein the lower end and the upper end of the seal ring make direct contact with the semiconductor layer and the protective insulating film, respectively, thereby providing a more reliable function of preventing the intrusion of a foreign substance.

The seal ring has a generally linear side portion and a corner portion, wherein the corner portion of the seal ring has a horizontal-plate-like subpad and the annular wall extends from the upper end of at least one interlayer insulating film described above to its lower end in the side portion of the seal ring, while extending from the lower end of the horizontal plate-shaped subpad to the lower end of at least one interlayer insulating film described above in the corner portion of the seal ring, thereby suppressing a bad shape of the seal ring caused by mask misalignment in the corner portion.

When the internal element region is provided in a region enclosed with a scribe region, the seal ring is preferably provided between the internal element region and the scribe region on the substrate.

When the internal element region is a memory region in which memory cells are disposed and further comprises a switching portion for changing the memory state of a memory cell in the memory region, the seal ring is preferably provided between the internal element region and the switching portion.

A method of manufacturing a semiconductor device according to the invention is a method of manufacturing a semiconductor device comprising each of a plurality of interlayer insulating films and a plurality of wiring layers each provided above a semiconductor layer on a substrate, a plug for making a vertical connection between wiring lines of the plurality of wiring layers or between the wiring and the semiconductor layer, an internal element region in which an element provided in the semiconductor layer, the wiring layer, and the plug are disposed, and a chip area outer periphery region in which an annular seal ring is disposed, wherein the annular seal ring is provided on the semiconductor layer through the plurality of interlayer insulating films and encloses the internal element region, and the method includes a step (a) for forming a hole for use in the plug and an annular groove configuring at least a portion of a region in which the seal ring is buried, in at least one interlayer insulating film of the plurality of interlayer insulating films, a step (b) for forming, on the substrate, a resist mask having an opening for a region including the hole for use in the plug, a step (c) for forming a shallower groove for use in wiring than the hole for use in the plug by etching using the resist mask, and a step (d) for forming the wiring and plug in the internal element region and also forming a vertical-plate-like annular wall extending, at least in a portion thereof, from the upper end of the interlayer insulating film to its lower end to configure a portion of the seal ring in the chip area outer periphery region, by depositing a conductive film on the substrate and, thereafter, removing the conductive film until the interlayer insulating film is exposed, thereby filling the groove for use in wiring, hole and annular groove with a portion of the conductive film.

According to this method, in the step (b), the annular groove for use in the seal ring is filled with the resist mask, and therefore, during forming a groove for use in wiring in the step (c), it is possible to suppress the occurrence of plasma damage to the substrate and wiring in a lower position. Also, since the occurrence of a foreign substance from the bottom of the annular groove can be suppressed and therefore a change in the etching rate can be suppressed, it is possible to suppress a change in the depth of a groove for wiring, i.e. the thickness of wiring buried in the interlayer insulating film, thereby suppressing variations in wiring resistance.

In the step (b), an opening is provided in a region of the photoresist mask including a portion of the annular groove, in the corner portion of the chip area outer periphery region, and in the step (c), a shallower groove for use in a pad than the annular groove is formed in a region including a portion of the annular groove, in the corner portion of the chip area outer periphery region, and in the step (d), by filling also the groove for use in a pad with a portion of the conductive film, a horizontal-plate-like subpad is formed in the corner portion of the chip area outer periphery region, and also the annular wall is formed extending from the upper end of the interlayer insulating film to its lower end in the side portion of the chip area outer periphery region while extending from the lower end of the subpad to the lower end of the interlayer insulating film in the corner portion of the chip area outer periphery region, thereby suppressing the occurrence of a bad shape of the seal ring possibly caused by misalignment of the resist mask.

DETAILED DESCRIPTION OF THE INVENTION

Embodiment

Figure 1A:
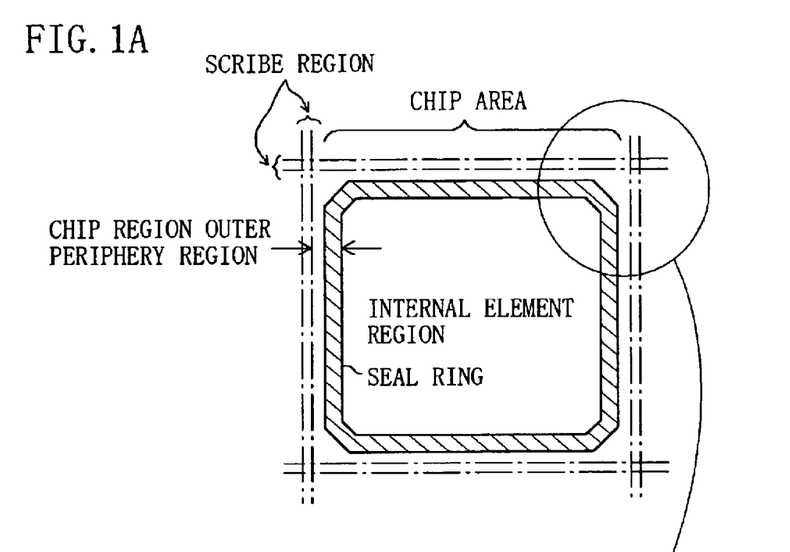
FIGS. 1A and 1B are a plan view for showing a chip area in a wafer according to an embodiment of the invention and a partial plan view for showing, through an insulating film, the neighborhood of a chip area corner portion of a semiconductor device provided in the chip area.
Figure 1B:
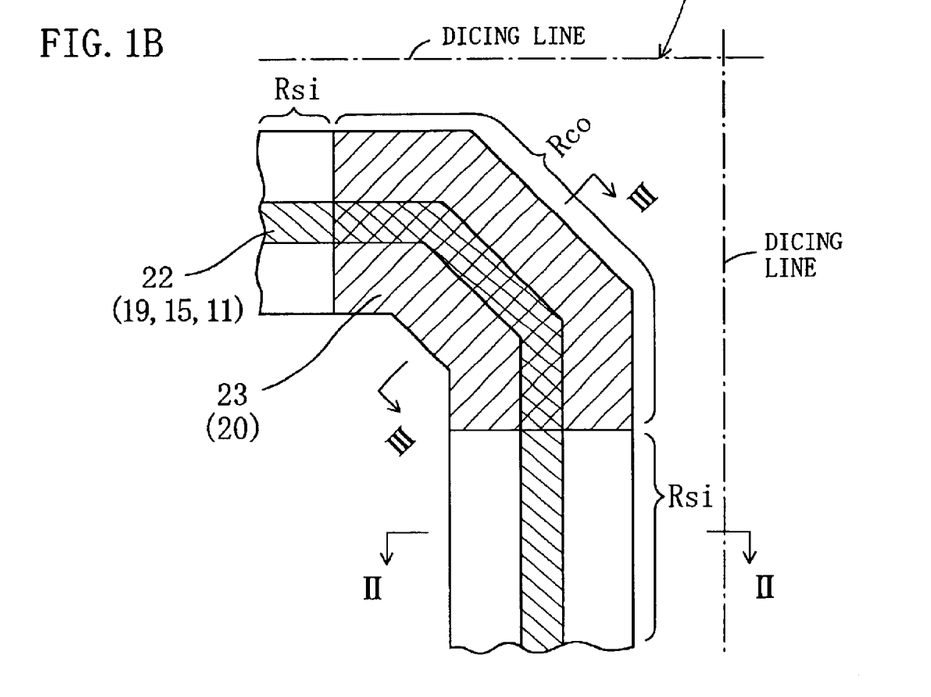
Figure 2:
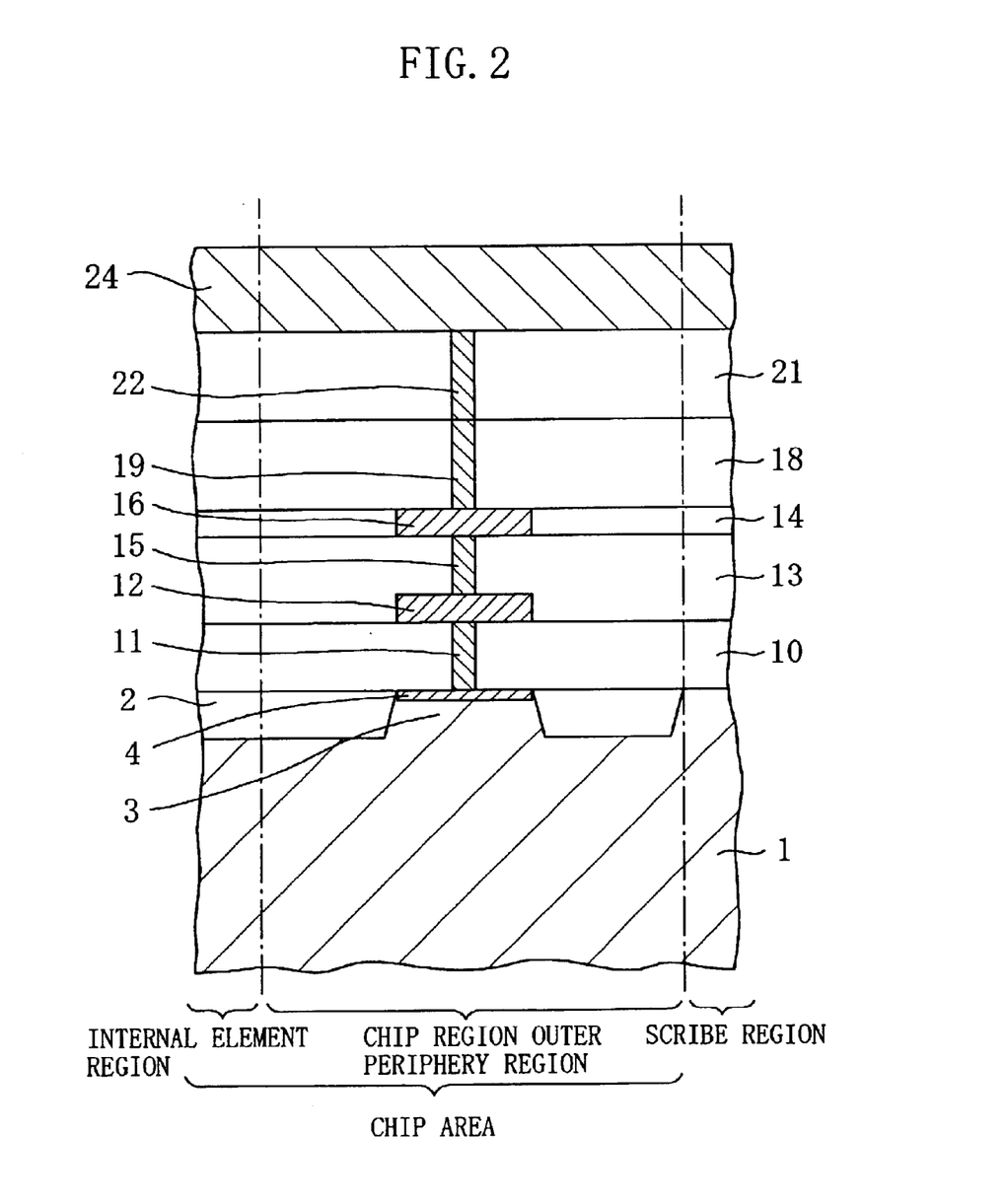
FIG. 2 is a cross sectional view of a semiconductor device according to the embodiment of the invention, taken along a II—II line shown in FIG. 1B.
Figure 3:
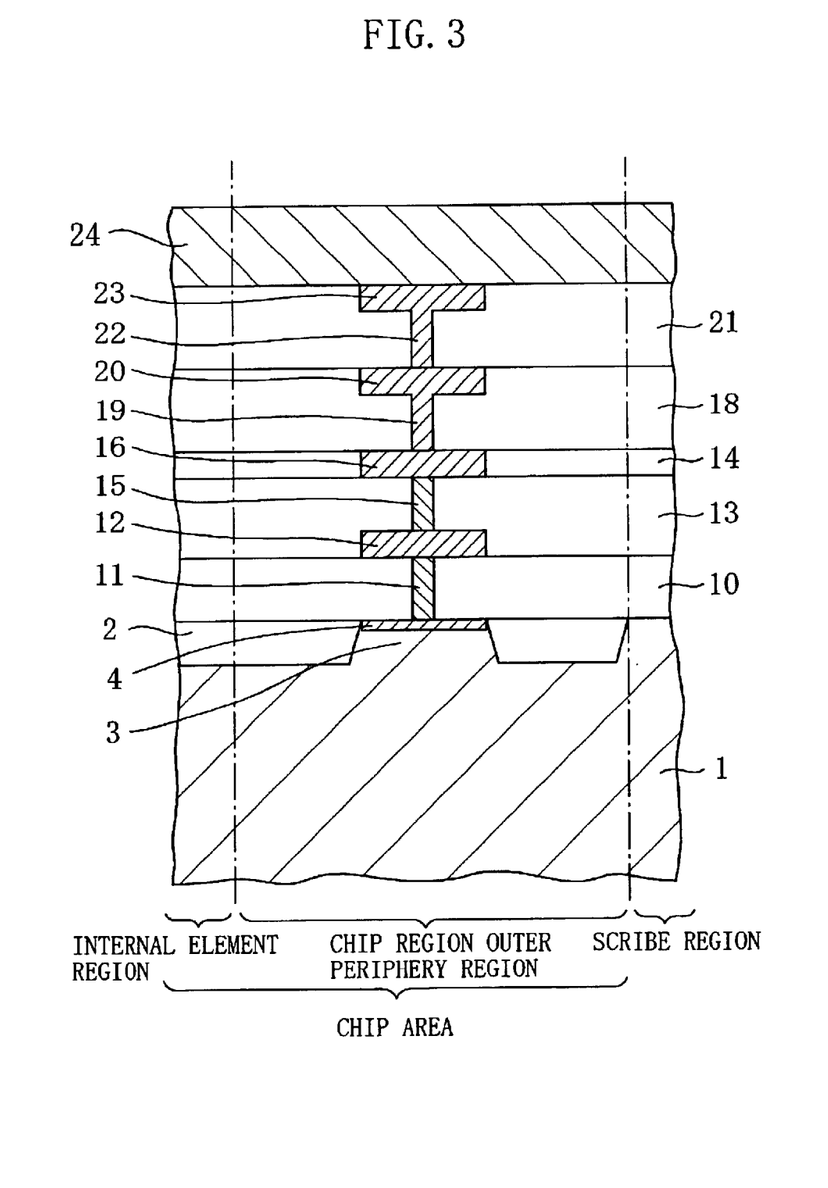
FIG. 3 is a cross sectional view of the semiconductor device according to the embodiment of the invention, taken along a III—III line shown in FIG. 1B.

FIGS. 1A and 1B are a plan view for showing a chip area in a wafer according to an embodiment of the invention and a partial plan view for showing, through an insulating film, the neighborhood of a chip area corner portion of a semiconductor device provided in the chip area. Further, FIG. 2 is a cross sectional view of the semiconductor according to the embodiment, taken along a II—II line shown in FIG. 1B. FIG. 3 is a cross sectional view of the semiconductor according to the embodiment taken along a III—III line shown in FIG. 1B. However, in FIG. 1B, two annular pads (12, 16) formed at the position corresponding to the lower layer wiring are omitted in showing.

As shown in FIGS. 1A and 1B, FIG. 2 and FIG. 3, a semiconductor device according to the present embodiment comprises a silicon substrate 1, element isolation 2 formed on the silicon substrate 1 and enclosing an active region 3, a diffusion layer 4 formed in the active region 3, a first interlayer insulating film 10 provided on the silicon substrate 1, a second interlayer insulating film 13 provided on the first interlayer insulating film 10, a third interlayer insulating film 14 provided on the second interlayer insulating film 13, a fourth interlayer insulating film 18 provided on the third interlayer insulating film 14, a fifth interlayer insulating film 21 provided on the fourth interlayer insulating film 18, and a humidity resistant insulating film 24 provided on the fifth interlayer insulating film 21. However, the semiconductor device of the embodiment is different from conventional semiconductor devices in that, in the embodiment, the seal rings in a corner portion Rco and a side portion Rsi of a chip area outer periphery region are partially different from each other in structure.

The Structure of a Corner Portion in the Chip Area Outer Periphery Region

First, as shown in FIGS. 1A and 1B and FIG. 3, the corner portion Rco in the chip area outer periphery region comprises a first annular wall 11 shaped like a vertical plate, composed of tungsten and the like, and reaching to the diffusion layer 4 through the first interlayer insulating film 10, a first annular pad 12 shaped like a horizontal plate, composed of tungsten and the like, and connected to the first annular wall 11 provided on the first interlayer insulating film 10, a second annular wall 15 shaped like a vertical plate, composed of tungsten and the like, and reaching to the first annular pad 12 through the second interlayer insulating film 13, a second annular pad 16 shaped like a horizontal plate, composed of Cu and the like, and connected to the second annular wall 15 buried in the third interlayer insulating film 14, a third annular wall 19 shaped like a vertical plate and a third subpad 20 shaped like a horizontal plate which are composed of Cu and the like and reach to the second annular pad 16 through the fourth interlayer insulating film 18, and a fourth annular wall 22 shaped like a vertical plate and a fourth subpad 23 shaped like a horizontal plate which are composed of Cu and the like and reach to the subpad 20 through the fifth interlayer insulating film 21. These annular walls 11, 15, 19, 22, the annular pads 12 and 16, and the subpads 20 and 23 configure the corner portion of a seal ring for preventing moisture and humidity from intruding into the internal element region. Further, in the corner portion Rco of the chip area outer periphery region, this seal ring has about the same structure as the seal ring provided in the chip area outer periphery region of the conventional semiconductor device described above.

The Structure of a Side Portion in the Chip Area Outer Periphery Region

On the other hand, as shown in FIGS. 1A and 1B and FIG. 2, the side portion Rsi of the chip area outer periphery region is provided with the first annular wall 11 composed of tungsten and the like and reaching to the diffusion layer 4 through the first interlayer insulating film 10, the first annular pad 12 composed of tungsten and the like and connected to the first annular wall 11 provided on the first interlayer insulating film 10, the second annular wall 15 composed of tungsten and the like and reaching to the first annular pad 12 through the second interlayer insulating film 13, the second annular pad 16 composed of Cu and the like and connected to the second annular wall 15 buried in the third interlayer insulating film 14, the third annular wall 19 composed of Cu and the like and reaching to the second annular pad 16 through the fourth interlayer insulating film 18, and the fourth annular wall 22 composed of Cu and the like and reaching to the third annular wall 19 through the fifth interlayer insulating film 21. These annular walls 11, 15, 19, 22 and the annular pads 12 and 16 configure the side portion of the seal ring for preventing the intrusion of moisture and humidity into the internal element region.

Therefore, a portion of the seal ring positioned on the side portion Rsi of the chip area outer periphery region does not have the third subpad 20 and fourth subpad 23 shaped like a horizontal plate, which is different from the seal ring provided in the chip area outer periphery region of the conventional semiconductor device described above. That is, the annular walls 19 and 22 shaped like a horizontal plate extend over from the upper end of the interlayer insulating film to the lower end in the side portion Rsi of the chip area outer periphery region. On the other hand, in the corner portion Rco of the chip area outer periphery region, the annular walls 19 and 22 extend from the lower end of the second annular subpad to the lower end of the above described interlayer insulating film. This point is a characteristic of the seal ring structure according to the present embodiment.

Here, the width of the annular pads and subpads described above are approximately equal to the width of wiring in the internal element region, and in contrast to this, the transversal thickness of the annular walls has a dimension approximately equal to the diameter of the via plugs. Generally, the thickness dimension of the annular walls is equal to the dimension of the design rule, but it can be a little larger than the dimension of the design rule.

Manufacturing Process

FIG. 4A to FIG. 7 are cross sectional views for showing a manufacturing process of the semiconductor device according to the invention. FIG. 4A to FIG. 7 show only the structures of the internal element region and the side portion Rsi of the chip area outer periphery region, and omits showing the structure of the corner portion Rco of the chip area outer periphery region. However, the cross sectional structures of the annular walls, annular pads and the like in the corner portion Rco, are approximately common to the cross sectional structures of the plugs and wiring in the internal element region.

Figure 4A:
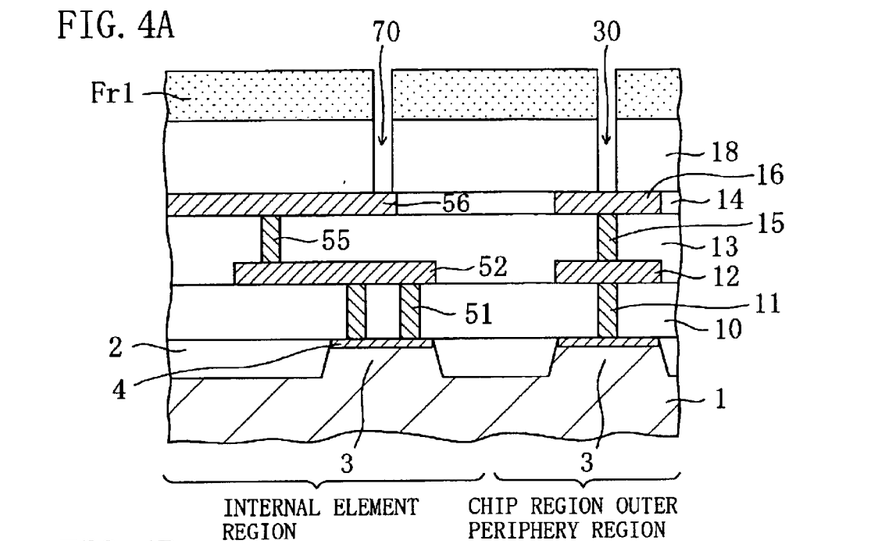
FIGS. 4A and 4B are cross sectional views for showing process steps up to the forming of a groove for use in a second layer wiring among manufacturing steps of the semiconductor device in the embodiment of the invention.

First, in the process step shown in FIG. 4A, after the element isolation 2 having a shallow trench structure and enclosing the active region 3 is formed on the surface of the silicon substrate 1, an element such as a MIS transistor is formed in the active region 3 of the internal element region. Next, the first interlayer insulating film 10 is deposited on the substrate, and thereafter, in the internal element region, contact holes each reaching to the active region 3, gate electrode (not shown) and the like through the first interlayer insulating film 10 are formed. At this time, in both the side portion Rsi and corner portion Rco of the chip area outer periphery region, an annular groove enclosing the internal element region is formed. Then, both the contact holes and the annular groove are filled in with tungsten and the like, thereby forming contact plug 51 and the first annular wall 11.

Next, a multilayer film composed of tungsten and the like is deposited on the substrate, and this film is patterned, whereby a local wiring 52 connected to a contact plug 51 and the first annular pad 12 connected to the first annular wall 11 are formed. Next, after the second interlayer insulating film 13 is deposited on the substrate, a first via hole reaching to the local wiring 52 and a second annular groove reaching to the first annular pad 12 are formed into the second interlayer insulating film 13 in the internal element region and in the side portion Rsi and corner portion Rco of the chip area outer periphery region, respectively. Further, the first via hole and the second annular groove are filled in with metal such as tungsten, whereby the first via plug 15 and a second annular wall 55 are formed in the internal element region and in the corner portion Rco and side portion Rsi of the chip area outer-periphery region, respectively.

Further, after the deposition of the third interlayer insulating film 14 on the substrate, a groove for use in a first layer wiring and a groove for use in a second annular pad are formed into the third interlayer insulating film 14 in the internal element region and in the corner portion Rco and side portion Rsi of the chip area outer periphery region, respectively. Then, the groove for a first layer wiring and the groove for a second annular pad are filled with Cu and the like by plating, whereby the first layer wiring 56 and the second annular pad 16 are formed in the internal element region and in the corner portion Rco and side portion Rsi of the chip area outer periphery region, respectively. That is, by a single damascene method, each wiring is formed.

Next, after the deposition of the fourth interlayer insulating film 18 on the substrate, a first photoresist pattern Fr1 is formed on the fourth interlayer insulating film 18, and by etching using this first photoresist pattern Fr1 as a mask, a second via hole 70 reaching to the first layer wiring 56 and a third annular groove 30 reaching to the second annular pad 16 are formed into the fourth interlayer insulating film 18 in the internal element region and in the side portion Rsi and corner portion Rco of the chip area outer periphery region, respectively.

Figure 4B:
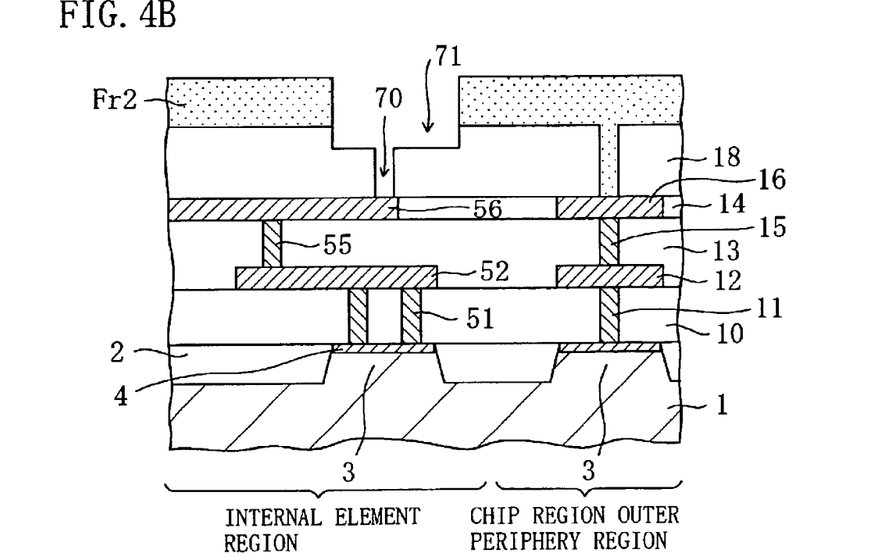

Next, in the process steps shown in FIG. 4B, after the removal of the first resist pattern Fr1, a second photoresist pattern Fr2 is formed on the fourth interlayer insulating film 18. At this time, the third annular groove 30 is filled with a portion of the second photoresist pattern Fr2. Then, by etching using the second photoresist pattern Fr2 as a mask, a groove 71 for use in the second layer wiring, having a width larger than a second via hole 70, is formed in the internal element region. At the same, a groove for use in a third subpad is formed in the corner portion Rco of the chip area outer periphery region, though not shown.

At this time, the groove 71 for use in the second layer wiring is formed in a large region including the second via hole 70, and although the second via hole 70 was once filled with a phoresist, the phoresist in the second via hole 70 is removed during forming the second ptoresist pattern Fr2. Therefore, during dry etching for forming the groove 71 for use in second-layer-wiring, Cu and the like come to be released from a portion of the first wiring 56 exposed at the bottom of the second via hole 70.

In contrast to this, in the side portion Rsi of the chip area outer periphery region, during dry etching for forming the groove 71 for use in the second layer wiring, the third annular groove 30 remains filled with a portion of the second photoresist pattern Fr2, and thereby Cu and the like are not released from the bottom of the third annular groove 30.

Further, in the corner portion Rco of the chip area outer periphery region, the groove for use in the third subpad has been formed in a region including a portion of the third annular groove 30 in the same manner as in the internal element region. Therefore, Cu and the like are released from a portion of the second annular pad 16 exposed at the bottom of the third annular groove 30 (see FIG. 3).

Figure 5A:
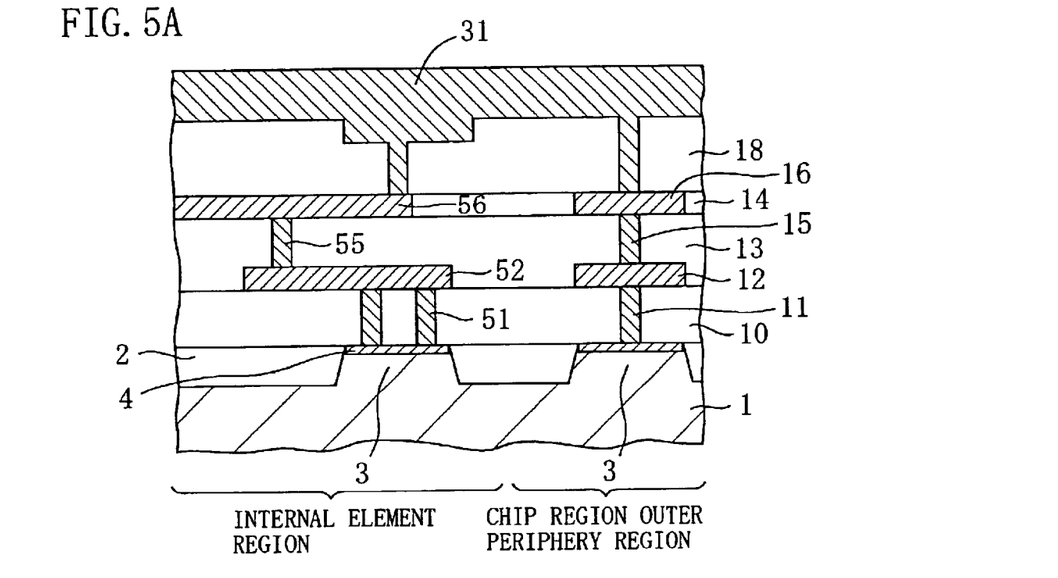
FIGS. 5A and 5B are cross sectional views for showing process steps up to the forming of the second layer wiring among manufacturing steps of the semiconductor device in the embodiment of the invention.

Next, in the process step shown in FIG. 5A, after the removal of the second photoresist pattern Fr2, a film 31 of Cu and the like is deposited on the substrate by plating. At this time, the second via hole 70 and the groove 71 for use in the second layer wiring in the internal element region, the third annular groove 30 in the side portion Rsi of the chip area outer periphery region, and the third annular groove and the groove for use in the third subpad in the corner portion Rco of the chip area outer periphery region are filled with a portion of the film 31 of Cu and the like.

Figure 5B:
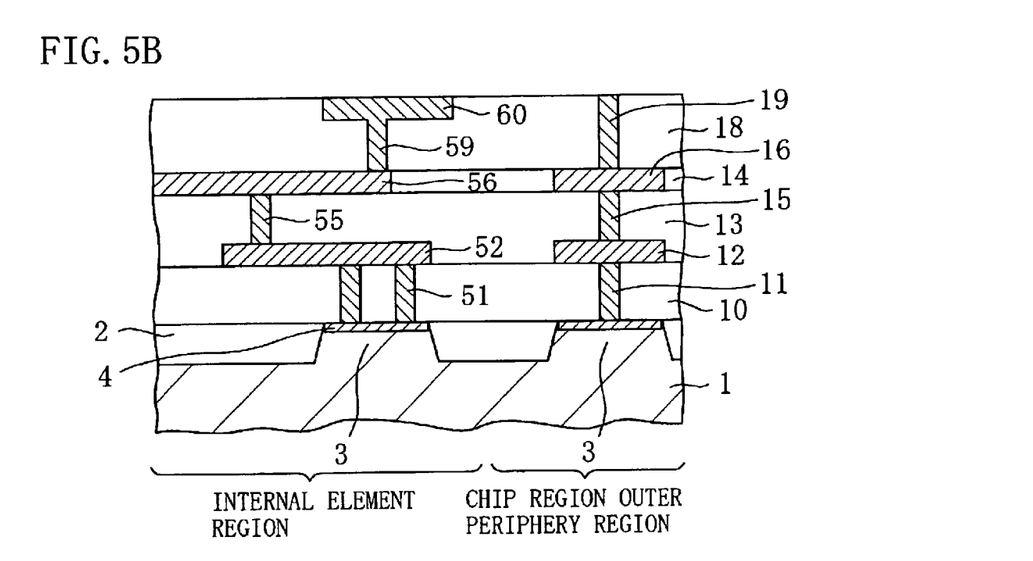

Next, in the process step shown in FIG. 5B, CMP is performed until the fourth interlayer insulating film 18 is exposed, and thereby forming a second via plug 59 and a second layer wiring 60 are formed in the internal element region, a side portion of the third annular wall 19 is formed in the side portion Rsi of the chip area outer periphery region, and a corner portion of the third annular wall 19 and the third subpad 20 are formed in the corner portion Rco of the chip area outer periphery region, respectively (see FIG. 3).

Figure 6A:
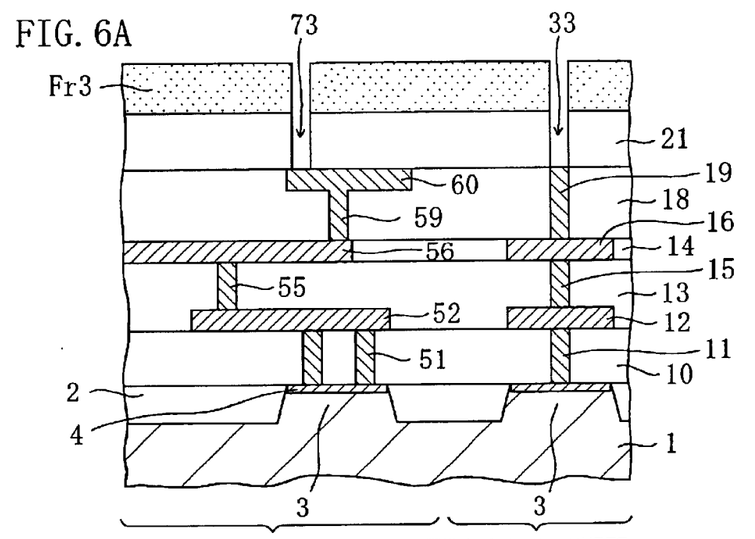
FIGS. 6A and 6B are cross sectional views for showing process steps up to the forming of a groove for use in a third layer wiring among manufacturing steps of the semiconductor device in the embodiment of the invention.

Next, in the process step shown in FIG. 6A, after the deposition of the fifth interlayer insulating film 21 on the substrate, a third photoresist pattern Fr3 is formed on the fifth interlayer insulating film 21. Then, using this third photoresist pattern Fr3 as a mask, etching is performed on the fifth interlayer insulating film 21 to form a third via hole 73 reaching to the second layer wiring 60 in the internal element region, and a fourth annular groove 33 reaching to the third annular wall 19 in the side portion Rsi of the chip area outer periphery region and reaching to the third subpad 20 in the corner portion Rco of the chip area outer periphery region, respectively.

Figure 6B:
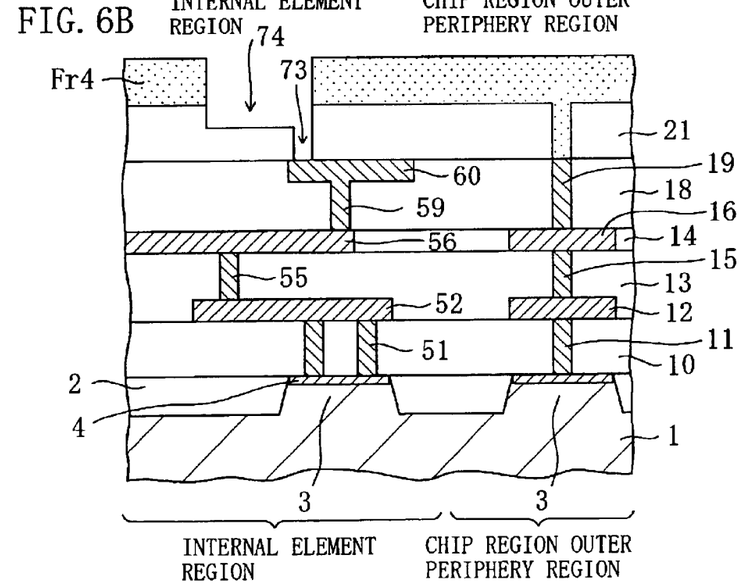

Next, in the process step shown in FIG. 6B, after the removal of the third photoresist pattern Fr3, a fourth photoresist pattern Fr4 is formed on the fifth interlayer insulating film 21. Then, by etching using the fourth photoresist pattern Fr4 as a mask, a groove 74 for use in a third layer wiring, larger than the third via hole 73, is formed in the internal element region. At the same time, a groove for use in a fourth subpad is also formed in the corner portion Rco of the chip area outer periphery region, though not shown.

At this time, the groove 74 for use in the third layer wiring is formed in a large region including the third via hole 73, and although the third via hole 73 was once filled in with a photoresist, during the formation of the fourth photoresist pattern Fr4, the photoresist in the third via hole 73 is removed. Therefore, during dry etching for forming the groove 74 for use in the third layer wiring, Cu and the like come to be released from a portion of the second layer wiring 60 exposed at the bottom of the second via hale 73.

In contrast to this, in the side portion Rsi of the chip area outer periphery region, during dry etching for forming the groove 74 for use in the third layer wiring, the fourth annular groove 33 remains filled with a portion of the fourth photoresist pattern Fr4, and thereby Cu and the like can not be released from the bottom of the fourth annular groove 33.

Further, in the corner portion Rco of the chip area outer periphery region, the fourth subpad groove is formed in a region including the fourth annular groove 33 in the same manner as in the internal element region, and therefore, Cu and the like may be released from a portion of the third subpad 20 exposed at the bottom of the fourth annular groove 33 (see FIG. 3).

Figure 7:
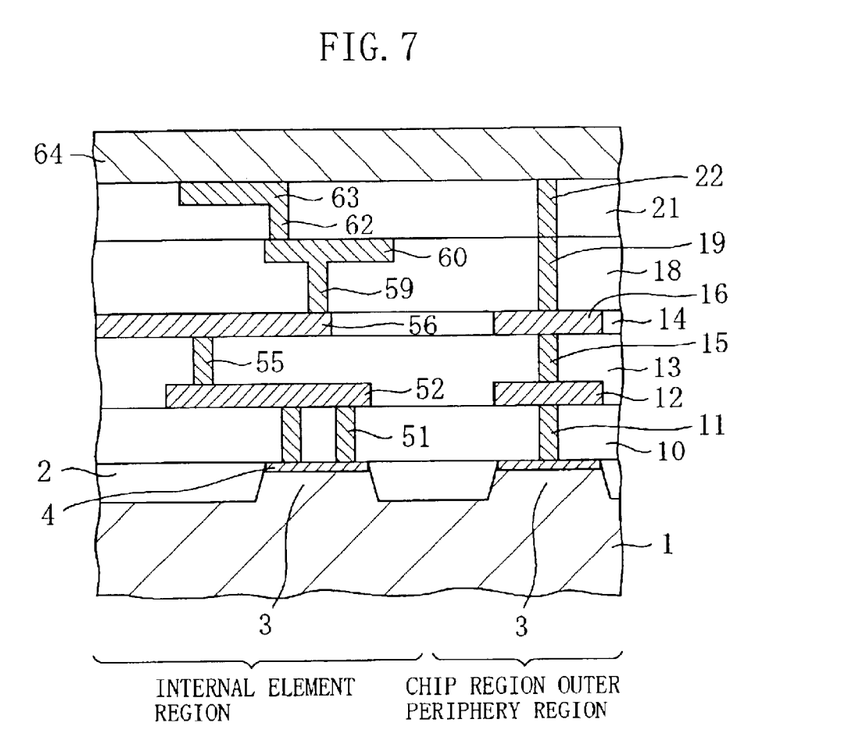
FIG. 7 is a cross sectional view for showing process steps up to the forming of the third layer wiring and a humidity-resistant protective film among manufacturing steps of the semiconductor device in the embodiment of the invention.

Next, in the process step shown in FIG. 7, after the removal of the fourth photoresist pattern Fr4, a film of Cu and the like is deposited on the substrate by plating. After that, CMP is performed until the fifth interlayer insulating film 21 is exposed, thereby forming a third via plug 62 and a third layer wirung 63 filling the second via hole 70 and the groove 71 for use in the second layer wiring in the internal element region, the fourth annular wall 22 filling the fourth annular groove 33 in the side portion Rsi of the chip area outer periphery region, and the fourth annular wall 22 and the fourth subpad 23 filling the fourth annular groove 33 and the groove for use in the fourth subpad in the corner portion Rco of the chip area outer periphery region, respectively (see FIG. 3).

According to the present invention, in the process steps for forming the wiring grooves in the dual damascene processes shown in FIG. 4B and FIG. 6, a pad groove is not formed in the side portion Rsi of the chip area outer periphery region, and therefore no opening having a large area exists therein. As a result, it is possible to suppress the occurrence of plasma damage to the lower side wiring (first layer wiring 56 and local wiring 52) and the substrate. Also, in the process stepes for forming the wiring grooves in the dual damascene processes shown in FIG. 4B and FIG. 6B, the side portion of the annular grooves for use in seal rings in the side portion Rsi of the chip area outer periphery region, i.e. the side portion of the annular grooves 30 and 33, are filled with a photoresist. Therefore, it is possible to prevent Cu and the like from being released from the bottom of the annular grooves 30 and 33 for use in the seal rings, having particularly a large area. Thereby, it is possible to suppress variations in the groove depths caused by changes in the etching rate, and thus to suppress variations in wiring thickness, thereby resulting in improved uniformity of wiring resistance.

By the way, in the process steps for forming the wiring grooves in the dual damascene processes shown in FIG. 4B and FIG. 6B, although Cu and the like can be released from the via holes 70 and 73 in the internal element region, no substantial problem arises because the area of these portions is much smaller than the area of the side portion Rsi of the chip area outer periphery region. Also, in the corner portion Rco of the chip area outer periphery region, during forming the subpad groove, Cu and the like can be released from the portion of the annular pad or subpad exposed at the bottom of the annular groove. However, the corner portion Rco of the chip area outer periphery region accounts for a very small proportion of the chip area outer periphery region, thereby resulting in almost no problem.

Further, instead of providing the pads in the corner portion Rco of the chip area outer periphery region, it is also possible to provide an annular wall vertically passing through the whole of the fourth interlayer insulating film 18 and the fifth interlayer insulating film 21 over the whole chip area outer periphery region. This method is preferable in respect of achieving increased uniformity in wiring resistance based on the suppressing of plasma damage and the preventing of the release of Cu and the like, which are basic effects of the present invention.

However, as in the present embodiment, only the annular wall is formed in the side portion Rsi of the chip area outer periphery region, while the subpads 20 and 23 are provided only in the corner portion Rco (see FIG. 3), thereby exerting the following advantages.

Since miss alignment of masks in the photolithography is generally easy to occur in the corner portion, a clearance can be created in between annular walls narrow in width, but the use of pads in stead of the walls can prevent clearance from being created in a portion of a seal ring. However, this problem can be avoided by making the corner portion of the annular wall thicker than the side portion thereof.

Further, in the case of using a phase shift mask, such as a halftone mask, side lobes are easy to occur particularly in the corner portion due to a proximity effect. As a result, holes may be produced in the interlayer insulating film in the proximity of the annular wall of the corner portion, resulting in deterioration in external appearance. Even in such a case, by forming the subpad only in the corner portion, the holes in the interlayer insulating film caused by side lobes can be filled, thereby preventing the occurrence of bad appearance.

Other Embodyment

The above embodiment has described an internal element region enclosed by a scribe line in relation to the structure of a seal ring for preventing the intrusion of moisture and humidity during scribing the wafer. However, the invention is not limited to this embodiment.

For example, in DRAM, SRAM and ROM, there are provided redundant memory cells in a memory portion in which DRAM memory cells are disposed, and when a bad memory cell is included, this bad cell is replaced with the redundant cell. In this case, a switching member (for example, fuse) is generally provided to switch an electrical connection to the peripheral circuit from the bad memory cell to a redundant memory cell. Further, a seal ring enclosing the memory portion may be provided in between the memory portion i.e. the internal element region and a region in which switching members are disposed. Then, the seal ring structure according to the invention can be applied to this seal ring.

What is claimed is:

1. A semiconductor device, comprising:

a plurality of wiring layers each comprising an interlayer insulating film and a wiring line provided above a semiconductor layer on a substrate;

a plug for making a vertical connection between wiring lines of said plurality of wiring layers or between one of said plurality of wiring layers and said semiconductor layer;

an internal element region in which an element provided in said semiconductor layer, said plurality of wiring layers, and said plug are disposed; and an annular seal ring provided on said semiconductor layer through at least one of said interlayer insulating films and enclosing said internal element region;

wherein one of said plurality of wiring layers has a dual damascene structure in which said wiring line and said plug connected below said wiring line are integrated, and which is formed in said at least one interlayer insulating film, and at least a portion of the part passing through said interlayer insulating film of said seal ring, in which one of said plurality of wiring layers having the dual damascene structure is formed, has a vertical-plate-like annular wall extending from the upper end to the lower end of said at least one interlayer insulating film.

2. The semiconductor device of claim 1, further comprising a protective insulating film covering said internal element region above it and having a function preventing the intrusion of a foreign substance, wherein the lower end and the upper end of said seal ring make direct contact with said semiconductor layer and said protective insulating film, respectively.

3. The semiconductor device of claim 1, wherein said seal ring has a generally linear side portion and a corner portion, said corner portion of said seal ring having a horizontal-plate-like subpad, and said annular wall extending from the upper end of said at least one interlayer insulating film to the lower end thereof in the side portion of said seal ring, while extending from the lower end of said horizontal plate-shaped subpad to the lower end of said at least one interlayer insulating film in the corner portion of said seal ring.

4. The semiconductor device of claim 1, wherein said internal element region is provided in a region enclosed with a scribe region on said substrate, and said seal ring is provided between said internal element region and the scribe region on said substrate.

5. The semiconductor device of claim 1, wherein said internal element region is a memory region in which memory cells are disposed and further comprises a switching portion for changing the memory state of a memory cell in said memory region, and the seal ring is provided between said internal element region and said switching portion.

6. The semiconductor device of claim 1, wherein said seal ring formed in said at least one interlayer insulating film, in which one of said wiring layers having the dual damascene structure is formed, has said vertical-plate-like annular wall extending from the upper end to the lower end of said at least one interlayer insulating film over the whole chip area outer periphery region.

7. The semiconductor device of claim 1, wherein one of said wiring layers having the dual damascene structure and said seal ring having said vertical-plate-like annular wall comprise a Cu material.

8. A semiconductor device, comprising:

an internal element region in which an element is provided in a semiconductor layer on a substrate;

a chip area outer periphery region, in which an annular seal ring is provided on said semiconductor layer, enclosing said internal element region;

an interlayer insulating film formed on said semiconductor layer; and a wiring layer provided in said interlayer insulating film of said internal element region having a dual damascene structure in which a wiring line and a plug connected below said wiring line are integrated, wherein said seal ring is provided in said interlayer insulating film within said chip area outer periphery region, and at least a portion of said seal ring has a vertical-plate-like annular wall extending from the upper end to the lower end of said interlayer insulating film.

9. The semiconductor device of claim 8, wherein said seal ring has a linear side portion and a corner portion, said corner portion of said seal ring having a horizontal-plate-like subpad, and said annular wall extending from the upper end of said interlayer insulating film to the lower end thereof in the side portion of said seal ring, while extending from the lower end of said horizontal plate-shaped subpad to the lower end of said interlayer insulating film in the corner portion of said seal ring.

10. The semiconductor device of claim 8, wherein said seal ring has said vertical-plate-like annular wall extending from the upper end to the lower end of said interlayer insulating film over the whole chip area outer periphery region.

11. The semiconductor device of claim 8, wherein said internal element region is provided in a region enclosed with a scribe region on said substrate, and said seal ring is provided on said chip area outer periphery between said internal element region and said scribe region.

12. The semiconductor device of claim 8, wherein said wiring layer and said seal ring comprise a Cu material.

* * * * *